(12) United States Patent
Jung

(10) Patent No.: US 9,218,887 B2
(45) Date of Patent: Dec. 22, 2015

(54) NONVOLATILE SEMICONDUCTOR MEMORY DEVICE CAPABLE OF IMPROVING RETENTION/DISTURB CHARACTERISTICS OF MEMORY CELLS AND METHOD OF OPERATING THE SAME

(71) Applicant: SK HYNIX INC., Icheon-si, Gyeonggi-do (KR)

(72) Inventor: Sung Wook Jung, Icheon-si (KR)

(73) Assignee: SK HYNIX INC., Icheon-Si, Gyeonggi-Do (KR)

( * ) Notice: Subject to any disclaimer, the term of this patent is extended or adjusted under 35 U.S.C. 154(b) by 0 days.

(21) Appl. No.: 14/186,665

(22) Filed: Feb. 21, 2014

(65) Prior Publication Data

US 2015/0092495 A1    Apr. 2, 2015

(30) Foreign Application Priority Data

Sep. 27, 2013    (KR) .......................... 10-2013-0115521

(51) Int. Cl.
G11C 16/24        (2006.01)
G11C 16/34        (2006.01)
G11C 16/04        (2006.01)

(52) U.S. Cl.
CPC ............ *G11C 16/24* (2013.01); *G11C 16/0483* (2013.01); *G11C 16/344* (2013.01); *G11C 16/3459* (2013.01)

(58) Field of Classification Search
CPC ........... G11C 16/0483; G11C 16/3445; G11C 16/3459
USPC ............. 365/185.22, 185.18, 185.12, 185.11, 365/185.17, 185.25, 185.09, 185.02
See application file for complete search history.

(56) References Cited

U.S. PATENT DOCUMENTS

| 6,438,035 B2 * | 8/2002 | Yamamoto et al. ...... 365/185.21 |
| 8,526,239 B2 * | 9/2013 | Kim ......................... 365/185.22 |
| 2013/0148433 A1 * | 6/2013 | Park .......................... 365/185.22 |

FOREIGN PATENT DOCUMENTS

| KR | 1019970029780 | 6/1997 |
| KR | 1020090120677 A | 11/2009 |

* cited by examiner

*Primary Examiner* — Andrew Q Tran
(74) *Attorney, Agent, or Firm* — Hauptman Ham, LLP

(57) ABSTRACT

A semiconductor memory device includes a memory cell array configured to store data; peripheral circuits configured to perform program verifying operation, read operation, and erase verifying operation on the memory cell array; and a control circuit configured to control the peripheral circuits, wherein the control circuit is configured to control the peripheral circuits to set a bit line voltage in the program verifying operation to have a higher level than a bit line voltage in the read operation, and a bit line voltage in the erase verifying operation to have a lower level than the bit line voltage in the read operation.

14 Claims, 4 Drawing Sheets

| | PROGRAM VERIFYING OPERATION | | READ OPERATION | | ERASE VERIFYING OPERATION |
|---|---|---|---|---|---|
| $V_{BL}$ | Vp | > | Vr | > | Ve |
| $I_{BL}$ | Ip | > | Ir | > | Ie |
| VT | VTp | < | VTr | < | VTe |

NONVOLATILE SEMICONDUCTOR MEMORY DEVICE CAPABLE OF IMPROVING RETENTION/DISTURB CHARACTERISTICS OF MEMORY CELLS AND METHOD OF OPERATING THE SAME

CROSS-REFERENCE TO RELATED APPLICATION

The present application claims priority to Korean patent application number 10-2013-0115521 filed on Sep. 27, 2013, in the Korean Intellectual Property Office. The disclosure of the above-listed application is hereby incorporated by reference herein in its entirety.

FIELD

This disclosure relates to a semiconductor memory device and a method of verifying the semiconductor memory device.

BACKGROUND

The statements in this section merely provide background information related to the present disclosure and do not constitute prior art.

A semiconductor memory device includes a memory cell array for storing data, peripheral circuits configured to program data in the memory cell array, or read or erase the programmed data, and a control circuit configured to control the peripheral circuits.

The memory cell array includes a plurality of memory blocks, and each of the plurality of memory blocks includes a plurality of memory cells. Memory cells are classified as a single-level cells (SLCs) having one program state per cell, and mufti-level cells (MLCs) having various program states per cell. MLCs are being used more recently. However, the inventor(s) has noted that since MLCs have a narrow width of each threshold voltage distribution, retention characteristics are design considerations. Examples of lowering the retention characteristics will be explained below.

FIG. 1A is a diagram of explaining a threshold voltage change of memory cells in an erase state.

Referring to FIG. 1A, a threshold voltage ER1 of memory cells in an erase state increases to a threshold voltage ER2 due to a read or program disturbance when a read or program operation is performed. The inventor(s) has experienced that, particularly, when the threshold voltage ER2 is higher than a read voltage (or verifying voltage), it is difficult to differentiate the erase state and the program state.

FIG. 1B is a diagram of explaining a threshold voltage change of memory cells in a program state.

Referring to FIG. 1B, a threshold voltage PGM1 of memory cells in a program state decreases to a threshold voltage PGM2 as time passes. This phenomenon occurs while electrons trapped in one memory cell escape. In particular, since the MLC in which one memory cell can be programmed in various states has a narrow width of each threshold voltage distribution and short intervals between different threshold voltage distributions, a read voltage (or verifying voltage) is included in the changed threshold voltage PGM2 distribution.

As described above, the inventor(s) has experienced that when the retention characteristics of memory cells in the erase state or the program state deteriorate, reliability of the read operation and the erase operation is lowered. Accordingly, the inventor(s) has experienced that reliability of the semiconductor memory device for performing the program operation, the read operation, and the erase operation is also lowered.

SUMMARY

In accordance with some embodiments, a semiconductor memory device comprises a memory cell array, peripheral circuits, and a control circuit. The memory cell array is configured to store data. The peripheral circuits are configured to perform program verifying operation, read operation, and erase verifying operation on the memory cell array. And the control circuit is configured to control the peripheral circuits. The control circuit is configured to control the peripheral circuits to set a bit line voltage in the program verifying operation to have a higher level than a bit line voltage in the read operation, and a bit line voltage in the erase verifying operation to have a lower level than the bit line voltage in the read operation.

In accordance with some embodiments, a semiconductor memory device is configured to: precharge bit lines to a first bit line voltage when the bit lines are precharged in a read operation; precharge the bit lines to a second bit line voltage higher than the first bit line voltage when the bit lines are precharged in a program verifying operation included in a program operation; and precharge the bit lines to a third bit line voltage lower than the first bit line voltage when the bit lines are precharged in an erase verifying operation included in an erase operation.

BRIEF DESCRIPTION OF THE DRAWINGS

The above and other features and advantages of the present disclosure will become more apparent to those of ordinary skill in the art by describing in detail exemplary embodiments thereof with reference to the attached drawings in which.

DETAILED DESCRIPTION

The present disclosure will be described more fully hereinafter with reference to the accompanying drawings, in which exemplary embodiments of the disclosure are shown. This disclosure, however, is embodied in different forms and should not be construed as limited to the exemplary embodiments set forth herein. The exemplary embodiments of this disclosure are provided for explaining in detail to be easily implemented by those of ordinary skill in the art.

Figure 1A:
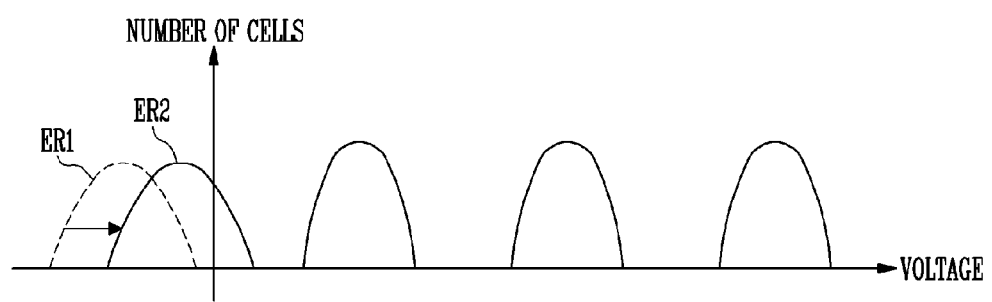
FIG. 1A is a diagram of explaining a threshold voltage change of memory cells in an erase state.
Figure 1B:
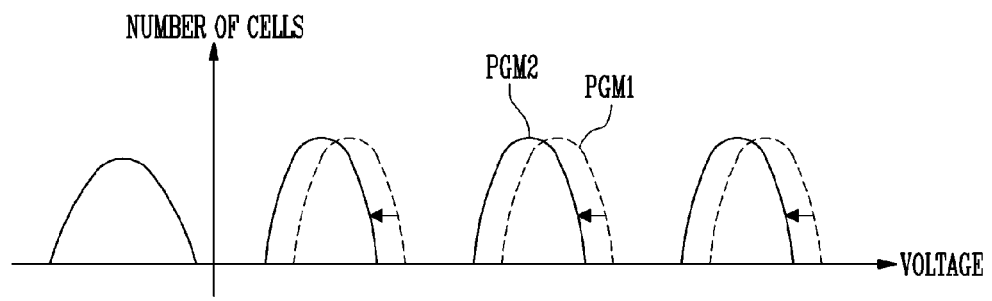
FIG. 1B is a diagram of explaining a threshold voltage change of memory cells in a program state.
Figure 2:
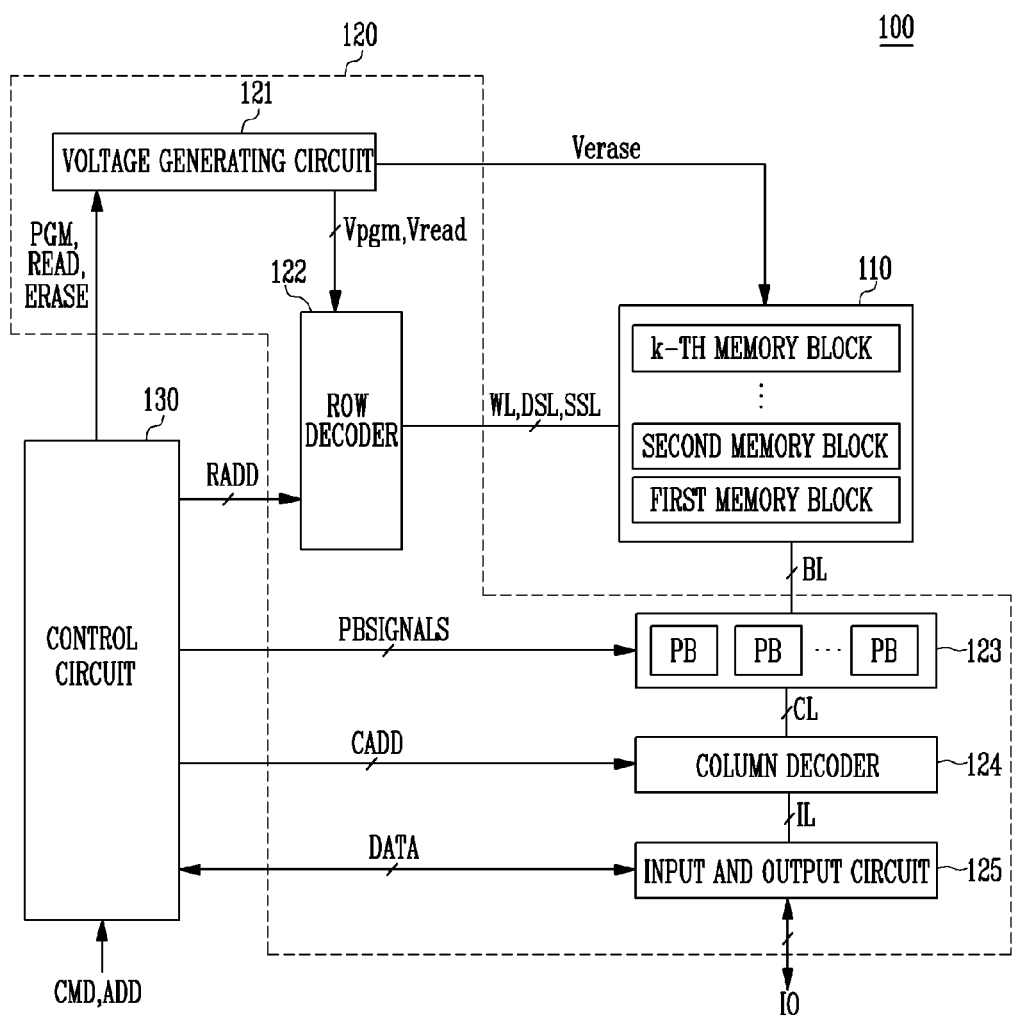
FIG. 2 is a diagram of explaining a semiconductor memory device according to at least one embodiment.

FIG. 2 is a diagram for explaining a semiconductor memory device according to at least one embodiment.

Referring to FIG. 2, the semiconductor memory device 100 includes a memory cell array 110 configured to store data, peripheral circuits 120 configured to perform program operation, read operation, and erase operation on the memory cell array 110, and a control circuit 130 configured to control the peripheral circuits 120. The program operation(s) is performed on a selected memory block in units of pages, and includes sub-program operation and program verifying operation. The sub-program operation means an operation of increasing threshold voltages of selected memory cells included in a selected page. The program verifying operation means an operation of checking whether threshold voltages of memory cells on which the sub-program operation is performed are higher than a target level, and determining whether the program operation is completed. The erase operation is performed on a selected memory block, and includes sub-erase operation and erase verifying operation. The sub-erase operation means an operation of decreasing threshold voltages of memory cells included in the selected memory block. The erase verifying operation means an operation of checking whether threshold voltages of memory cells on which the sub-erase operation is performed are lower than a target level, and determining whether the erase operation is completed. The read operation is similar to the program verifying operation or the erase verifying operation.

The memory cell array 110 includes first to k-th memory blocks. The first to the k-th memory blocks include a plurality of memory cells for storing data. Each of the first to the k-th memory blocks has the same configuration, and a detailed circuit will be described below with reference to FIG. 3.

The peripheral circuits 120 include a voltage generating circuit 121, a row decoder 122, a page buffer group 123, a column decoder 124, and an input and output circuit 125.

The voltage generating circuit 121 is configure to generate a program voltage Vpgm, a read voltage Vread, an erase voltage Verase or a verifying voltage in each response to a program signal PGM, a read signal READ, or an erase signal ERASE output from the control circuit 130. For example, the voltage generating circuit 121 is configured to generate the program voltage Vpgm and the read voltage Vread to supply them to the row decoder 122, and to generate the erase voltage Verase to supply it to the memory cell array 110. Although not shown, the voltage generating circuit 121 is configured to generate various voltages needed for the program operation, the read operation and the erase operation in addition to the program voltage Vpgm, the read voltage Vread, and the erase voltage Verase.

The row decoder 122 is configured to select one among the first to the k-th memory blocks in response to a row address RADD output from the control circuit 130, and to transfer a voltage supplied from the voltage generating circuit 121 to word lines WL, a drain select line DSL, and a source select line SSL connected to a selected memory block.

The page buffer group 123 includes a plurality of page buffers PB configured to temporarily store data in response to page buffer control signals PBSIGNALS output from the control circuit 130. The plurality of page buffer buffers PB are connected to the memory cell array 110 through bit lines BL, and transfer the temporarily stored data to the bit lines BL or store data transferred to the bit lines BL from the memory cell array 110 in response to the page buffer control signals PBSIGNALS.

Particularly, the plurality of page buffers PB is configured to transfer different bit line voltages to the bit lines BL according to control of the control circuit 130 during the program verifying operation, the read operation, and the erase verifying operation, in order to improve retention characteristics of memory cells. For example, a voltage with a different level is output for precharging the bit lines BL during each of the program verifying operation, the read operation, and the erase verifying operation.

The column decoder 124 is connected to the page buffers PB through column lines CL, and is configured to transfer data to the plurality of page buffers PB or receives data from the plurality of page buffers PB in response to a column address CADD.

The input and output circuit 125 is connected to the column decoder 124 through input and output lines IL, and is configured to transfer input and output data IO to the column decoder 124 or to transfer data transferred from the column decoder 124 to the outside in response to a data signal DATA output from the control circuit 130.

The control circuit 130 is configured to output the operation signal PGM, READ, or ERASE, the row address RADD, the page buffer signals PBSIGNALS, the column address CADD, and the data signal DATA in response to a command signal CMD and an address signal ADD to control the peripheral circuits 120. Especially, the control circuit 130 is configured to control the page buffer group 123 to transfer bit line voltages with various levels to bit lines during the program verifying operation, the read operation, and the erase operation.

Figure 3:
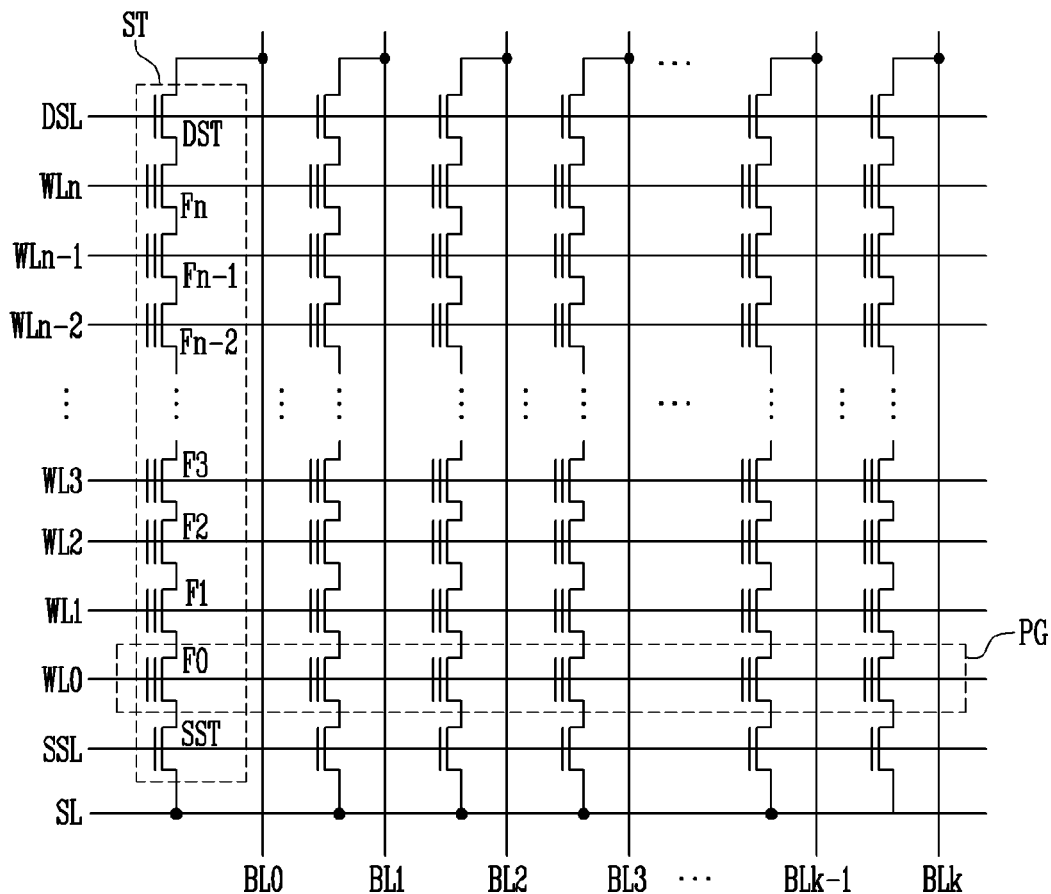
FIG. 3 is a circuit diagram of explaining any one of memory blocks included in a memory cell array according to at least one embodiment.

FIG. 3 is a circuit diagram of explaining any one of memory blocks included in a memory cell array according to at least one embodiment.

Referring to FIG. 3, each of the first to k-th memory blocks included in the memory cell array has the same construction, and a construction of the first memory block shown in FIG. 3 as an example will be explained below just for explanation convenience.

The first memory block includes a plurality of strings ST connected between a source line SL and bit lines BL0 to BLk. The source line SL is commonly connected to the plurality of strings ST, and the bit lines BL0 to BLk are connected to the plurality of strings ST.

The plurality of strings ST include select transistors DST, memory cells F0 to Fn, and source select transistors SST, which are serially connected. Drains of drain select transistors DST are connected to the bit lines BL0 to BLk, and sources of the source select transistors SSL are commonly connected to the source line SL. Gates of the drain select transistors DST included in different strings ST are connected to the drain select line DSL, gates of the memory cells F0 to Fn are connected to the word lines WL0 to WLn, and gates of the source select transistor SST are connected to the source select line SSL. A group of memory cells included different strings ST and connected to the same word line is referred to as a page PG. The program operation and the read operation are performed in units of pages, and the erase operation is performed in units of memory blocks.

Figure 4:
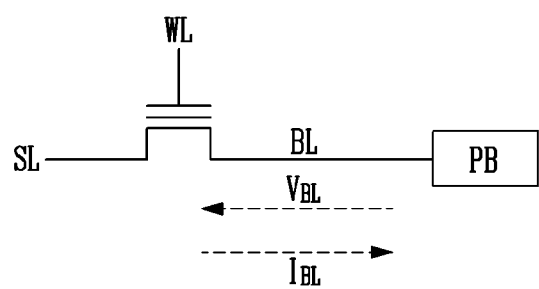
FIG. 4 is a diagram of explaining a relationship between a voltage and a current of a bit line according to at least one embodiment.

FIG. 4 is a diagram of explaining a relationship between a voltage and a current of a bit line according to at least one embodiment.

Referring to FIG. 4, in order to explain the relationship between the bit line voltage $V_{BL}$ and the bit line current $I_{BL}$, a memory cell, a source select line SL, a bit line BL, and a page buffer PB included in a string ST are simply illustrated.

The program verifying operation, the erase verifying operation, and the read operation include precharging the bit line BL by applying the bit line voltage $V_{BL}$ to the bit line BL, and sensing the bit line current $I_{BL}$.

$$I_{BL} = \frac{V_{BL}}{R_{BL}} \quad \text{[Equation 1]}$$

As shown in Equation 1, since bit line resistance $R_{BL}$ is constant, the bit line current $I_{BL}$ is proportional to the bit line voltage $V_{BL}$. Accordingly, in the state in which the source line SL is connected to a ground terminal, the bit line current $I_{BL}$ increases when the bit line voltage $V_{BL}$ increases, and the bit line current $I_{BL}$ decreases when the bit line voltage $V_{BL}$ decreases. In the precharging of the bit line BL, the plurality of page buffers PB supply the bit line voltage $V_{BL}$ having various levels to the bit line BL, and in the sensing of the bit line current $I_{BL}$, the plurality of page buffers PB sense the bit line current $I_{BL}$. For example, when a threshold voltage of a selected memory cell is lower than a verifying or read voltage supplied to the word line WL, the plurality of page buffers PB sense the bit line current $I_{BL}$ with a lower level since a current path is generated between the source line SL and the bit line BL. On the other hand, when the threshold voltage of the selected memory cell is higher than the verifying or read voltage supplied to the word line WL, the plurality of page buffers PB sense the bit line current $I_{BL}$ having a higher level since the current path is not generated between the source line SL and the bit line BL. The control circuit 130, as shown in FIG. 2, is configured to determine states of memory cells according to a signal output from the plurality of page buffers PB. That is, during the verifying operation (or read operation), the determining of whether the threshold voltage of the selected memory cells is higher or lower than the verifying voltage (or read voltage) depends on the bit line current $I_{BL}$. Accordingly, since it is determined whether the program verifying operation or the erase verifying operation is completed according to the bit line current $I_{BL}$ sensing in the plurality of page buffers PB, the threshold voltages of the memory cells in the program operation or the erase operation can be adjusted. A detailed method will be explained below with reference to FIG. 5.

Figures 5, 6:
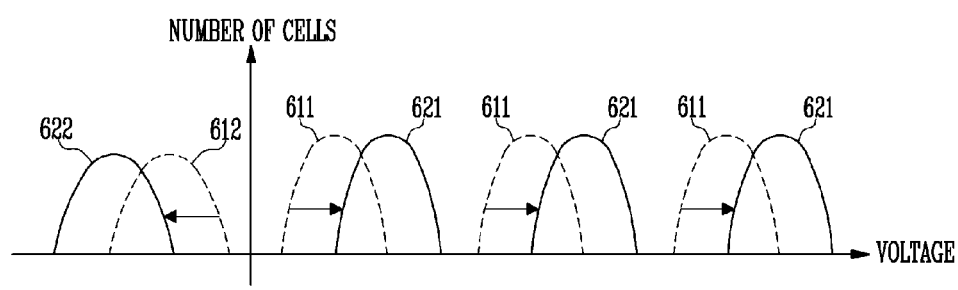
FIG. 5 is a diagram of explaining a bit line voltage applied to a bit line during program verifying operation, read operation, and erase verifying operation according to at least one embodiment.
FIG. 6 is a diagram for explaining threshold voltage distributions of memory cells according to at least one embodiment.

FIG. 5 is a diagram of explaining a bit line voltage supplied to a bit line during program verifying operation, read operation, and erase verifying operation according to at least one embodiment, and FIG. 6 is a diagram of explaining threshold voltage distributions of memory cells according to at least one embodiment.

Referring to FIGS. 5 and 6, a bit line current $I_{BL}$ has a difference value, and thus threshold voltages of memory cells can be adjusted during the program operation and the erase operation by differently setting bit line voltages $V_{BL}$ applied to bit lines in order to precharge the bit lines during the program verifying operation, the read operation, and the erase verifying operation. For convenience of explanation, hereinafter, in the program verifying operation, the bit line voltage $V_{BL}$ is defined as Vp, the bit line current $I_{BL}$ as Ip, and the threshold voltage VT of the memory cells as VTp. Further, in the read operation, the bit line voltage $V_{BL}$ is defined as Vr, the bit line current $I_{BL}$ as Ir, and the threshold voltage VT of the memory cells as VTr. Moreover, in the erase operation, the bit line voltage $V_{BL}$ is defined as Ve, the bit line current $I_{BL}$ as Ie, and the threshold voltage VT of the memory cells as VTe.

The bit line voltage Vp in the program verifying operation and the bit line voltage Ve in the erase verifying operation based on the bit line voltage Vr in the read operation will be explained below as an example.

The bit line voltage Vp in the program verifying operation is set to have a higher level than the bit line voltage Vr in the read operation, and the bit line voltage Ve in the erase operation is set to have a lower level than the bit line voltage Vr in the read operation.

Since the current is proportional to the voltage, when the bit line voltage Vp in the program verifying operation of the program operation is set to have a higher level than the bit line voltage Vr in the read operation, the bit line current Ip in the sensing of the bit lines is greater than the bit line current Ir in the read operation. Since the great bit line current Ip means that a great current flows through the bit line, the control circuit 130 determines that the threshold voltages VTp of the memory cells are lower than a target level in the program verifying operation. That is, in the program verifying operation, even when the threshold voltages of the selected memory cells are substantially higher than the target level, the control circuit 130 determines that the threshold voltages VTp of corresponding memory cells are lower than the target level. For example, the control circuit 130 determines that the threshold voltages of a portion of the memory cells adjacent to the target level do not reach the target level. Accordingly, as shown in FIG. 6, in the program operation, even when the threshold voltages of the selected memory cells are higher than the target level 611, the control circuit 130 does not determine that the program operation is completed, and further controls the peripheral circuits 120 to perform the program operation on the selected memory cells. Accordingly, the threshold voltages of the selected memory cells are higher than the target level in the program operation 621. The bit line voltage Vp is set by considering the decrement of the threshold voltage due to degradation of retention characteristics of the memory cells. For example, when the threshold voltage decreases about 0.3 V due to the degradation of the retention characteristics of the memory cells, the bit line voltage Vp is set to have an increased level by about 0.3 V based on a reference set level.

Since the current is proportional to the voltage, when the bit line voltage Ve in the erase verifying operation of the erase operation is set to have a lower level than the bit line voltage Vr in the read operation, the bit line current Ip in the sensing of the bit lines is smaller than the bit line current Ir in the read operation. Since the small bit line current Ip means that the current flowing through the bit lines is small, the control circuit 130 determines that the threshold voltage VTe is higher than a target level in the erase operation. That is, even when the threshold voltages VTe of the selected memory cells are substantially lower than the target level in the erase verifying operation, the control circuit 130 determines that the threshold voltages VTe of corresponding memory cells are higher than the target level. For example, the control circuit 130 determines that the threshold voltages of a portion of the memory cells adjacent to the target level are higher than the target level. Accordingly, as shown in FIG. 6, in the erase operation, even when the threshold voltages of the selected memory cells are lower than the target level 612, the control circuit 130 does not determine that the erase operation is completed, and further controls the peripheral circuits 120 to perform the erase operation on the selected memory cells. Accordingly, the threshold voltages of the selected memory cells are lower than the target level in the erase operation 622. The bit line voltage Ve is set by considering the increment of the threshold voltage due to erase disturb degradation and interference. For example, when the threshold voltages of the memory cells in an erase state increase about 0.3 V due to interference capable of occurring in the program operation and the read operation on peripheral memory cells or memory blocks, the bit line voltage Ve is set to have a decreased level by about 0.3 V based on a reference set level.

For example, when the bit line voltage Vr is set to 1.3 V in the read operation, the bit line voltage Vp in the program verifying operation is set to 1.6 V, and the bit line voltage Ve in the erase verifying operation is set to 1.0 V.

In at least one embodiment described above, the bit line voltage Vp in the program verifying operation is set to increase and the bit line voltage Ve in the erase verifying operation Ve is set to decrease based on the bit line voltage Vr in the read operation. However, the bit line voltage Vr in the read operation and the bit line voltage Ve in the erase operation are set to decrease based on the bit line voltage Vp in the program operation, and the bit line voltage Vr in the read operation and the bit line voltage Vp in the program verifying operation are set to increase based on the bit line voltage Ve in the erase verifying operation. On the other hand, the bit line voltage Vp in the program operation and the bit line voltage Ve in the erase operation are each set, and a middle level between the set bit line voltages Vp and Ve is a level of the bit line voltage Vr in the read operation.

As described above, disturb and retention characteristics are improved by setting the bit line voltages Vp, Vr and Ve for precharging the bit lines differently in the program verifying operation, the read operation, and the erase operation.

According to the various embodiments, since retention characteristics of memory cells are improved, reliability of a semiconductor memory device is improved.

Various embodiments described above are not limited to a device and a method but is implemented through a program implementing functions corresponding to the features of embodiments or a non-transitory, computer-readable recording medium where the program is recorded. Such implementation is easily done by a person of ordinary skill in the art based on the description of the embodiments.

In the drawings and specification, there have been disclosed typical exemplary embodiments of this disclosure, and although specific terms are employed, they are used and are to be interpreted in a generic and descriptive sense only and not for purposes of limitation. In some instances, as would be apparent to one of ordinary skill in the art as of the filing of the present application, features, characteristics, and/or elements described in connection with a particular embodiment are used singly or in combination with features, characteristics, and/or elements described in connection with other embodiments unless otherwise specifically indicated. Therefore, it will be understood by those of ordinary skill in the art that various changes in form and details can be made therein without departing from the spirit and scope of the claimed invention as set forth in the following claims.

What is claimed is:

1. A semiconductor memory device, comprising:
a memory cell array configured to store data;
peripheral circuits configured to perform a program verifying operation, a read operation, and an erase verifying operation on the memory cell array; and
a control circuit configured to control the peripheral circuits, wherein the peripheral circuits are configured to apply a first bit line voltage to bit lines when a read voltage is applied to a word line of selected memory cells in the read operation, apply a second bit line voltage to the bit lines when a first verifying voltage is applied to the word line in the program verifying operation, and apply a third bit line voltage to the bit lines when a second verifying voltage is applied to the word line in the erase verifying operation,
wherein the second bit line voltage is higher than the first bit line voltage and the third bit line voltage is lower than the first bit line voltage,
wherein the second bit line voltage is set to have a higher level than the first bit line voltage based on retention characteristics of the memory cells in the semiconductor memory device, and the third bit line voltage is set to have a lower level than the first bit line voltage based on disturb characteristics of the memory cells in the semiconductor memory device.

2. The semiconductor memory device of claim 1, wherein the peripheral circuits comprise:
a voltage generating circuit configured to generate the first verifying voltage, the second verifying voltage, a program voltage, the read voltage or an erase voltage in response to a program signal, a read signal or an erase signal;
a row decoder configured to select one among a plurality of memory blocks included in the memory cell array in response to a row address, and transfer a voltage generated by the voltage generating circuit to the selected memory block;
a page buffer group configured to temporarily store data in response to page buffer control signals, and output bit line voltages with various levels to the bit lines;
a column decoder configured to transfer data to the page buffer group in response to a column address, or receive data from the page buffer group; and
an input and output circuit configured to transfer data to the column decoder in response to a data signal, or output data transferred from the column decoder.

3. The semiconductor memory device of claim 2, wherein the control circuit is configured to output the program signal, the read signal, or the erase signal, and output the row address, the page buffer control signals, the column address and the data signal, in response to a command signal and an address.

4. The semiconductor memory device of claim 2, wherein the page buffer group is configured to output the bit line voltages with the various levels to the bit lines according to control of the control circuit.

5. The semiconductor memory device of claim 2, wherein the peripheral circuits are configured to perform a program operation on the selected memory block in units of pages, the program operation including a sub-program operation and the program verifying operation.

6. The semiconductor memory device of claim 5, wherein the peripheral circuits are configured to
in the sub-program operation, increase threshold voltages of memory cells included in the selected memory block,
in the program verifying operation, check whether the threshold voltages of the memory cells on which the sub-program operation is performed are higher than a target level, and
determine whether the program operation is completed.

7. The semiconductor memory device of claim 2, wherein the peripheral circuits are configured to perform an erase operation on the selected memory block, the erase operation including a sub-erase operation and the erase verifying operation.

8. The semiconductor memory device of claim 7, wherein the peripheral circuits are configured to
in the sub-erase operation, decrease threshold voltages of memory cells included in the selected memory block,
in the erase verifying operation, check whether the threshold voltages of the memory cells on which the sub-erase operation is performed are lower than a target level, and
determine whether the erase operation is completed.

9. A method of operating a semiconductor memory device, the method comprising:

precharging bit lines by applying a first bit line voltage to the bit lines when a read voltage is applied to a word line of selected memory cells in a read operation;

precharging the bit lines by applying a second bit line voltage to the bit lines when a first verifying voltage is applied to the word line in a program verifying operation included in a program operation; and precharging the bit lines by applying a third bit line voltage to the bit lines when a second verifying voltage is applied to the word line in an erase verifying operation included in an erase operation, wherein the second bit line voltage is higher than the first bit line voltage and the third bit line voltage is lower than the first bit line voltage, wherein the second bit line voltage is set to have a higher level than the first bit line voltage based on retention characteristics of the memory cells in the semiconductor memory device, and the third bit line voltage is set to have a lower level than the first bit line voltage based on disturb characteristics of the memory cells in the semiconductor memory device.

10. The method of claim 9, wherein the program operation is performed on a selected memory block in units of pages, and includes a sub-program operation and the program verifying operation.

11. The method of claim 10, wherein
the sub-program operation includes increasing threshold voltages of selected memory cells included in a selected page of the selected memory block, and
the program verifying operation includes checking whether the threshold voltages of the memory cells on which the sub-program operation is performed are higher than a target level and determining whether the program operation is completed.

12. The method of claim 9, wherein the erase operation is performed on a selected memory block, and includes a sub-erase operation and the erase verifying operation.

13. The method of claim 12, wherein
the sub-erase operation includes lowering threshold voltages of memory cells included in the selected memory block, and
the erase verifying operation includes checking whether the threshold voltages of the memory cells on which the sub-erase operation is performed are lower than a target level and determining whether the erase operation is completed.

14. A semiconductor memory device, comprising:
a memory cell array configured to store data;
peripheral circuits configured to perform a program verifying operation, a read operation, and an erase verifying operation on the memory cell array; and
a control circuit configured to control the peripheral circuits, wherein the peripheral circuits are configured to apply a first bit line voltage to bit lines coupled to the memory cell array in the read operation, apply a second bit line voltage to the bit lines in the program verifying operation and apply a third bit line voltage to the bit lines in the erase verifying operation,
wherein the second bit line voltage is higher than the first bit line voltage and the third bit line voltage is lower than the first bit line voltage,
wherein the second bit line voltage is set to have a higher level than the first bit line voltage based on retention characteristics of the memory cells in the semiconductor memory device, and the third bit line voltage is set to have a lower level than the first bit line voltage based on disturb characteristics of the memory cells in the semiconductor memory device.

* * * * *